United States Patent

[11] 3,569,607

[72] Inventors John E. Martyak
Beacon;
Morton D. Reeber, Shrub Oak; Charles Wurms, Wappingers Falls, N.Y.
[21] Appl. No. 846,836
[22] Filed Aug. 1, 1969
[45] Patented Mar. 9, 1971
[73] Assignee International Business Machines Corporation
Armonk, N.Y.

[54] RESOLDERABLE CONNECTOR
20 Claims, 4 Drawing Figs.

[52] U.S. Cl. .......... 174/68.5, 29/626, 317/101, 339/17
[51] Int. Cl. .......... H05k 1/18, H05k 3/32
[50] Field of Search .......... 174/68.5; 317/101 (C), 101 (CC), 101(CM), 101 (D); 339/17, 17 (C), 275, 275 (B); 29/626, 627; 228/56

[56] References Cited
UNITED STATES PATENTS
3,205,298 9/1965 Kalt .......... 174/68.5
3,214,827 11/1965 Phohofky .......... 174/68.5X

*Primary Examiner*—Darrell L. Clay
*Attorney*—Hanifin & Jancin

ABSTRACT: This patent discloses a resolderable connector particularly adapted for interconnecting multilayer modules with circuit boards and the like, but not limited thereto, the multilayer modules including a monolithic ceramic body with interconnected electrical conductors bonded to the ceramic. The modules include conductive terminations on at least one of the external surfaces of the ceramic body. Connected to these external conductive terminations are cuplike receptacles having a good solder wettable interior and a poor solder wettable exterior, the cuplike receptacles being connected to the conductive terminations as by brazing, but at any rate by a means having a higher melting temperature than conventional lead-tin solder so that bringing the receptacles to a temperature to heat the solder so that they may receive pins from projecting circuit boards does not cause release of the receptacles from the ceramic body.

INVENTORS
JOHN E. MARTYAK
MORTON D. REEBER
CHARLES WURMS

BY William J. Dick
ATTORNEY

RESOLDERABLE CONNECTOR

SUMMARY OF THE INVENTION AND STATE OF THE PRIOR ART

The present invention relates to connectors and more particularly to solder-type connectors which permit of repeated use without losing their ability to be reconnected.

In the manufacture of multilayer circuits and the like, for example as by the method taught in the patent to Stetson, Pat. No. 3,189,978, it is necessary to make a plurality of connections to the multilayer module to permit various inputs and outputs to and from the module. Additional connections, of course, must be made to the module to permit powering of the various active devices on the module. Conventionally, the modules are soldered to a circuit board having a plurality of projections on the card which interface with connections on the module. In the first place, such connections are difficult to make because of the difficulty in heating all of the connections simultaneously. Furthermore, alignment becomes increasingly difficult and critical as the number of connectors increases.

Additional problems manifest themselves in that at the time the entire system is "brought up," it is necessary to remove and replace various of the modules. In large machines such as computers, individual components on a particular card or printed circuit board may have to be taken off and resoldered a great number of times, commonly in excess of ten or more. When the connectors or the projections on the card are copper, initial wetting of the copper and connection to the copper is simple as the solder easily forms an intermetallic with the copper. However, copper and conventional lead-tin solder form an intermetallic far too easily, and when a joint that has been soldered is reheated and the old part removed and then reheated again for subsequent insertion of that part, any more than two to four times, it has been discovered that the solder becomes too well diffused with the copper and the melting point of the solder raises until after it has been reheated a number of times, it is difficult to cause the composite intermetallic structure of the solder-copper combination to be easily remelted by a soldering iron or the like. Additionally, it has been discovered that after a plurality of reheatings, the solder and the copper joint becomes brittle.

In view of the above, it is a principal object of the present invention to provide a solder receptacle which may be loaded easily with solder, for example, of the lead-tin type, and which is made of a material which, although solder wettable, does not appreciably alloy or react readily with the solder or form a spalling intermetallic with the solder so as to permit multiple heating and cooling without deleterious effect.

Another object of the present invention is to provide a cuplike receptacle for solder, which receptacle has a good solder wettable interior having a limited reactivity with solder and a poor solder wettable exterior so that the receptacles may be utilized in closely spaced proximity to one another without fear of solder bridging between adjacent receptacles.

Still another object of the present invention is to provide a solder receptacle particularly adapted for use in conjunction with multilayer modules, which receptacles permit some misalignment between the projections on the printed circuit board or card and the receptacles on the multilayered module.

Yet another object of the present invention is to provide a multilayered module having a plurality of cup-shaped solder receptacles on at least one external surface thereof, which receptacles permit easy fastening and detachment to and from adjacent objects having projections also located at spaced intervals for interconnection therewith.

Yet another object of the present invention is to provide projecting means which mate with the solder cup receptacles of the present invention and permit rapid soldering and unsoldering of the module to and from a card or printed circuit substrate.

Other objects and a fuller understanding of the invention may be had by referring to the following specification and claims taken in conjunction with the accompanying drawings in which:

FIG. 1 is a fragmentary perspective view of a module having conductive terminations on one surface of the module, and to which the receptacles of the present invention may be attached;

FIG. 2 is an enlarged fragmentary sectional view of a portion of a module such as shown in FIG. 1 and to which has been connected a plurality of the receptacles of the present invention, and showing one manner in which the receptacles may be connected to projections from an adjacent substrate or the like;

Figures 1, 2, 3, 4:
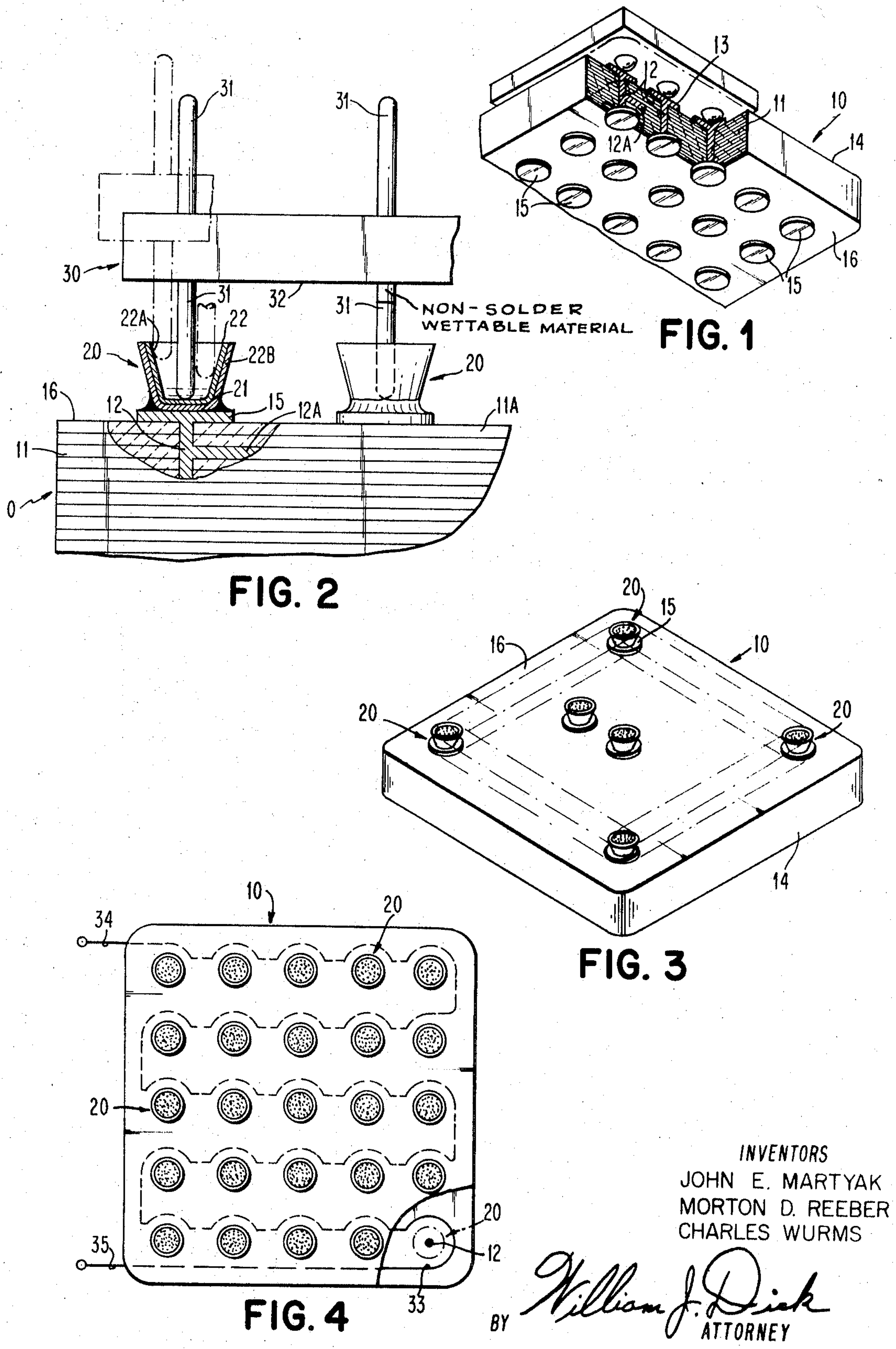

FIG. 3 is a perspective view showing a few of the receptacles of the present invention positioned on the carrier of module illustrated in FIG. 1, some of the receptacles being removed for clarity; and FIG. 4 is a plan view of a module illustrating the manner in which the modules may have all of their cuplike receptacles heated simultaneously to permit interconnection of the modules to an adjacent connecting body.

Referring now to the drawing and especially FIG. 1 thereof, a module or device 10 in the present instance comprising a plurality of dielectric sheets or layers 11, which may be composed of such materials as ceramics which for purposes of this patent includes glass, synthetic resin plastics or the like, is shown therein. The module 10 may be manufactured in a variety of ways, for example, to form a monolithic ceramic body by the method as proposed in the Stetson Pat. No. 3,189,978 issued Jun. 22, 1965.

In the process set forth in Stetson, a ceramic body is formed in different layers, the ceramic body and electrical conductors therein being sintered to form a monolithic structure. For purposes of illustration, it will be assumed that the monolithic structure or module 10 is formed by the process described in Stetson, but it should be understood that the present invention is useful with any electronic circuit utilizing a substrate which must be connected by solderable connectors to an adjacent substrate or circuit board.

As illustrated in FIG. 1, the module 10 comprises interconnected electrical conductors 12 which include eyelets or pads 13 on the upper surface 14 of the module, some of the conductors extending through the module 10 and terminating in spaced conductive terminations or pads 15 disposed on the lower external surface 16 of the module 10. As illustrated, some portions 12A of the conductors 12 are disposed in different layers or intermediate the layers 11.

Although the conductive terminations 15 as well as the conductors 12 may be composed of any of a number of materials, for example the conductive terminations 15 may be tungsten which is formed in a conventional manner by screening onto the lower surface 16 of the module 10, and thereafter firing, making a porous matrix which may be filled with copper. In a like manner, the conductors 12 as well as the portions 12A may be composed of, for example, a molybdenum trioxide, which is fired forming a matrix for the receipt of copper.

In accordance with the invention, a cuplike solder receptacle and connector 20 may be connected to at least some of the conductive terminations 15, the connectors 20 being adapted to hold a quantity of solder, while being reheatable and reusable a plurality of times so as to permit interconnection of the module 10 a number of times without recharging the cups and without encountering the problems normally faced when attempting to resolder, with the same solder, copper connections. To this end, the solder receptacle and connector 20 is preferably cup-shaped, that is having a truncated conical body with a narrower base portion 21 than mouth portion 22, the mouth being disposed to face away from the lower surface 16 of the module 10. Additionally, because the normal electrical lead-tin solder forms an intermetallic with copper to an extent which increases brittleness and raises the necessary temperature required for melting the solder upon repeated remelting, it is desirable to form or manufacture the receptacle and connector 20 of a refractory solderable material on the interior which has good solder wettability with limited reactivity with solder, but which has a poor solder wettable exterior. To this end, the receptacles 20 may be composed of a laminate having a first material 22A on the interior of the receptacle, and a second material 22B on the exterior of the receptacle. Preferably, the first material 22A is nickel, while the poorly wettable exterior or second material 22B is composed of an alloy such as Kovar.*

*Kovar is a trademark of Westinghouse Electric CorporationThe structure of the receptacle and connector 20 is, in the present instance, a laminate, but may be formed by any other well-known process in which a refractory solderable wettable interior 22A is mated with a poorly solderable wettable exterior 22B. While nickel is the preferable material for the interior, such other refractory solderable materials as tungsten, molybdenum, etc. may be acceptable if fired in a reducing or cleansing atmosphere (ex. hydrogen furnaces). It should be recognized that the interior material should be solder wettable while having limited reactivity with solder, so as to inhibit any tendency to form an intermetallic with the solder intended for use in the receptacles. In other words, the interior material should be such that it will not appreciably dissolve in solder or form a spalling intermetallic therewith.

With regard to the poorly wettable exterior material 22B, as is well-known, Kovar is an alloy which is composed of approximately by weight, 29 percent nickel, 17 percent cobalt, and 53 percent iron with small fractions of manganese, silicon, and carbon. Although other materials may be utilized as the exterior, such as tantalum, stainless steel, or Inconel, Kovar has been found to be economical when utilized as the exterior of the connector 20. By making the exterior of the connector of a poor solder wettable material, bridging of solder between adjacent connectors 20, such as the connectors shown in FIGS. 2 and 3, is prevented upon heating and reusing the solder connectors.

In order to connect the solder receptacles and connectors 20 to the conductive terminations or pads 15, it is desirable that the means for connecting the connectors 20 to the pads have a melting temperature in excess of that of the solder, such as lead-tin, which will be used in the connector, so that upon heating the connectors to cause the solder carried therein to become liquid, unintentional removal of the connector from the pad 15 is not effected. To this end, Kovar is very easily brazed by a normal copper-silver brazing material and may be connected in this manner to the pads 15. However, it has been discovered that the alloy Nioro which is made by Wesco and contains approximately 82 percent by weight of gold and 18 percent nickel is a preferable brazing material. The reason for this is that the copper-silver brazing material tends to creep over the edges of the cup forming a bond with the nickel and causing the exterior 22B of the connector 20 to become solder wettable. The connectors 20 may be brazed to the conductive terminations or pads 15 by placing a disc-shaped piece of the brazing alloy beneath the cup of the connector 20 and thereafter placing the module 10 along with the cups mounted thereon in a hydrogen furnace and heating the module so that the brazing alloy forms an integral connection with the Kovar and the conductive terminations 15.

It should be noted that Kovar, if clean, is solder wettable and therefore must be oxidized, prior to use as the external material of the connector 20 of the present invention. Kovar may be oxidized by merely permitting it to sit at room temperature in a normal atmosphere for a week to two weeks. However, the rate of oxidation may be accelerated by injecting moisture into the atmosphere after the brazing temperature has been reached and while the modules and connectors are cooling.

After the connectors 20 have been connected to the module 10, for example by the aforementioned method, small quantities of solder and flux may be placed in the connectors and the module reheated to a temperature sufficient to cause the solder to become liquid, wetting the interior surface 22A of the connector 20, the connector then being permitted to cool.

In order to facilitate ease of removal and connection to and from adjacent substrates, such as the circuit board 30, intermediate the lower layers 11 of the module 10 and adjacent the surface 16 of the module may be positioned tungsten or other resistive lead lines 33 (see FIG. 4). The lines 33 may be screened on one or the other layer 11A so that it is sandwiched between the lowermost layers 11 adjacent the lower surface 16 of the module 10. If the conductor or lead 33 is formed so as to lie closely adjacent to at least portions of the conductive terminations 15, the extending leads 34 and 35 projecting from the module pin may easily be connected to a power supply (not shown) to permit current to flow through the leads 33 heating the pads or conductive terminations 15 and causing the solder in the connectors 20 to become liquid.

The initial connection of the module 10 to, for example, the projecting pins 31 of the board 30 is easily facilitated by placing a small amount of flux on the pins 31, applying power to the power supply connectors 34 and 35 thus liquifying the solder and lowering the board 31 until the pins enter the liquid surface of the molten solder. Because the mouth 22 of the connectors 20 is wider than the base 21, any small misalignment of the pins is more easily tolerated thus permitting the connection of the board 30 to the module 10 in a rapid manner.

To prevent the pins 31, upon repeated insertion and removal from the connectors 20, from forming a spalling intermetallic with the lead-tin solder, it is preferable that the projections or pins be composed of a material which will inhibit the formation of an intermetallic, or have limited reactivity or will not appreciably dissolve in solder. Thus, the pins 31 may be composed of a material such as nickel, or preferably may be a nickel coated Kovar so that the too rapid formation of an intermetallic is prevented. Additionally, as Kovar has poor heat conductivity characteristics, if the substrate is a board, such as a printed circuit board, the heat will not be so rapidly transferred to the delicate foil on the circuit board and thus prevent, in this manner, damage to the board 30. It should be recognized that the pins 31 may have a portion thereof, adjacent the substrate 30, composed of a non-solder wettable material to prevent inadvertent creeping of the solder upwardly into contact with the substrate 30. Such an embodiment is illustrated, by way of example, in the right-hand portion of FIG. 2.

The receptacles of the present invention were tested, the test results being compared with a copper receptacle in the following manner:

TEST 0 1

(1) Four copper receptacles, similar to the receptacles of the present invention were provided; each of the receptacles had a generally tubular shape with a mean diameter of approximately 0.043 inches. The wall thickness of the receptacles was 0.003 inches, while the height was 0.030 inches.

(2) The receptacles were placed on a hot plate and a small amount of Kester 1544 was heated in the receptacle until the agitation of the flux subsided.

(3) Lead-tin solder (63 percent lead and 37 percent tin) was placed in the receptacles and the solder was allowed to melt, a temperature of 225° C being maintained for approximately 3 minutes.

(4) After cooling to approximately room temperature, a drop of Kester 1544 flux was placed on the hardened solder in each of the solder receptacles.

(5) Four copper (Amzirc) pins 0.015 inches each in diameter (Amzirc = 99 percent + copper with a trace of zirconium) were placed on top of the surface of the solder in each of the copper receptacles intercepting the drop of Kester solder in each of the receptacles.

(6) The receptacles were heated to approximately 225° C and held at that temperature for 3 minutes, the solder being permitted to cool.

(7) The pins were later removed by bringing the receptacles once again to 225° C and holding the temperature for 3 minutes.

(8) Subsequent insertions and removals were effected by the same method as outlined in steps 4—7.

An examination after the first two insertions and removals to and from the copper receptacles noted that the entire volume of the solder melted and refroze and that the surface of the solder was smooth and shiny. In a like manner, the submerged tips of the pins were also shiny and smooth upon withdrawal from the receptacles. Upon the third insertion of the pins into their respective solder receptacles some solder crept out of the receptacles and, although the solder in the receptacles and on the pins was reasonably smooth, the appearance of the solder in the receptacles was somewhat frosty, while the solder on the pins had a lumpy and ragged appearance.

Upon the fifth insertion of the pins into the copper solder receptacles: solid material was noticed in the liquid solder, the liquid material receding from the solid material at a temperature of 225° C. At this point the intermetallic became brittle and the pins, upon removal, had a very lumpy, ragged, and dull gray appearance.

On the seventh insertion the total volume of solder in the bucket was reduced by 50 percent over the initial volume present upon the first insertion. The remaining solder had crept up and deposited on the pin and over the sides of the receptacle. The solder, when in a liquid phase, was quite lumpy and somewhat mushy in appearance and the joint produced upon cooling was considered no longer useful, as it was easily broken.

TEST 0 2

Nickel Kovar receptacles having frustoconical shapes with a base of 0.030 inches, a mouth of 0.040 inches, a height of 0.030 inches, and a wall thickness of 0.002 inches were brazed onto a test vehicle. The same procedure as outlined above relative to the copper was followed, that is, the receptacles were placed on hot plates and cleaned by the Kester 1544 flux, loaded with lead-tin solder which was allowed to melt, permitted to harden and then a drop of flux was placed on the top of the cooled mass and later upon reheating, nickel Kovar pins were inserted. The times of heating, cooling, and the temperatures are identical with that set forth above. As a result of the tests, the solder in the receptacles and on the pins were almost identical, including strength, after 20 insertions and removals of the nickel Kovar pins. Even after 40 insertions and removals the solder in the receptacle and on the pins was still working as a solder system.

Utilizing nickel-Kovar buckets, and Amzirc pins, it took 15 insertions and removals of the Amzirc pins prior to the solder in the receptacles and on the pins taking on an appearance similar to that described after only 3 insertions and removals of the Amzirc pins in Test 01.

It should be recognized that the metal of the interconnected electrical conductors, as well as the conductive terminals may be formed by any other well-known process such as vacuum metalization, screening, pyrolytic decomposition, plating or sputtering, while the ceramic or glass formation may be manufactured by screening, pyrolytic decomposition, sputtering, sedimentation of glass frit, doctoring or lamination (Stetson). In no way is the formation of the conductive terminations or ceramic to be considered critical to the receptacle of the present invention.

It should be recognized that the receptacle of the present invention alleviates the problem of irregular shrinkage when utilizing ceramic substrates by permitting attachment of the receptacle to the substrates after they have been fired and shrinkage has occurred. Additionally, by utilizing an external solder receptacle inadvertent breakage or damage to one or more receptacles does not necessarily dictate discarding of the entire module.

It should also be recognized that utilizing an external solder receptacle permits tailoring of the module and its external connection points as designed while freeing other areas on the external surface for additional circuitry, etc.

Although the invention has been described with a certain degree of particularity, it is understood that the present disclosure has been made only by way of example and that numerous changes in the details of construction and the combination and arrangement of parts may be made without departing from the spirit and the scope of the invention as hereinafter claimed.

We claim:

1. A device comprising a resolderable connector attached to a conductive termination on an external surface of a body, said connector comprising a cup-shaped receptacle having a refractory, solderable interior having a limited reactivity with solder and a poor solder wettable exterior, and means connecting said cup to said conductive termination, said means having a melting temperature in excess of the melting temperature of the solder composition intended for use interiorly of said receptacle.

2. A device comprising a resolderable connector connected to a conductive termination on an external surface of a substrate, said connector comprising a cup-shaped receptacle composed of at least two materials, the first of said materials being on the interior of said receptacle, said first material exhibiting solder wettable characteristics while being free of appreciable dissolution in solder and said second material exhibiting poor solder wettable characteristics; and means connecting said receptacle to said substrate.

3. A device in accordance with claim 2 including solder in said receptacle and wherein said means connecting said receptacle to said substrate has a melting temperature in excess of that of the solder in said receptacle; said receptacle being connected to said termination with its' open portion facing away from said external surface.

4. A device in accordance with claim 3 wherein said solder is of a lead-tin composition.

5. A device in accordance with claim 2 wherein said first material is nickel.

6. A device in accordance with claim 2 wherein said second material comprises an alloy of nickel, cobalt and iron treated to render the surface thereof poorly solder wettable.

7. A device in accordance with claim 2 wherein said first material is nickel and said second material comprises an alloy of nickel, cobalt and iron treated to render the surface thereof poorly solder wettable.

8. A device in accordance with claim 2 including solder in said receptacle a pin disposed in said receptacle and soldered thereto, said pin having at least the portion thereof in said receptacle composed of a refractory solderable material exhibiting solder wettable characteristics while having a limited reactivity with solder.

9. A device in accordance with claim 8 wherein at least said portion of said pin disposed in said receptacle is composed of nickel.

10. In an electronic circuit comprising a monolithic ceramic body and interconnected electrical conductors bonded to said ceramic, portions of said conductors being disposed in different layers; conductive terminations from a plurality of said conductors disposed on an external surface of said ceramic body, and an improved reusable solder connector; said improved connector comprising: a cup-shaped receptacle having a refractory solderable interior and a poor solderable wettable exterior, and means connecting a plurality of said receptacles respectively to a plurality of said conductive terminations; said receptacles being connected to said terminations with their open portions facing away from said external surface.

11. In an electronic circuit in accordance with claim 10 including solder in said receptacles, and wherein said means connecting a plurality of said receptacles to a plurality of said conductive terminations has a melting temperature in excess of that of the solder intended for use interiorly of said receptacles.

12. A circuit module comprising a monolithic circuit structure and interconnected electrical conductors, conductive terminations from a plurality of said conductors disposed on an external surface of said monolithic circuit structure, and resolderable solder connectors attached to at least one of said terminations; each of said connectors comprising a cup-shaped receptacle having a metal interior with limited reactivity with solder and being solder wettable, and an exterior composed of a different material and being poorly wettable by solder, and means connecting a plurality of said receptacles respectively to a plurality of said terminations.

13. A circuit module in accordance with claim 12 wherein said module is comprised of a plurality of layers forming a monolithic ceramic body.

14. A circuit module in accordance with claim 12 wherein said cup-shaped receptacles are composed of a laminate material.

15. A circuit module in accordance with claim 12 including solder in at least some of said receptacles and means in said module for heating said receptacles to melt said solder.

16. A circuit module in accordance with claim 12 including solder in at least some of said receptacles and including an adjacent substrate having a plurality of spaced conductive projections extending from one surface thereof, said spacing between said projections being substantially the same as the spacing between said receptacles, said projections being solder wettable and connected to said metal interior of said receptacles by said solder.

17. A circuit module in accordance with claim 16 wherein said projections have at least a refractory solderable portion.

18. A circuit module in accordance with claim 17 wherein said projections comprise pins having at least a portion thereof adjacent said substrate composed of a nonsolder wettable material.

19. A circuit module in accordance with claim 12 wherein said metal interior having a limited reactivity with solder is nickel.

20. A circuit module in accordance with claim 12 wherein said exterior metal of said receptacles comprises an alloy of nickel, cobalt and iron treated to render the surface thereof poorly solder wettable.

PO-1050
(5/69)

UNITED STATES PATENT OFFICE
CERTIFICATE OF CORRECTION

Patent No. 3,569,607 Dated March 9, 1971

Inventor(s) John E. Martyak et al

It is certified that error appears in the above-identified paten and that said Letters Patent are hereby corrected as shown below:

In the specification:

Column 2, line 14: "of" (second occurrence) should be -- or --

In the claims:

Claim 2, Column 6, line 17: after "receptacle" ins -- and the second of said materials being the exterior of said receptacle --

Signed and sealed this 25th day of January 1972.

(SEAL)
Attest:

EDWARD M.FLETCHER,JR.
Attesting Officer

ROBERT GOTTSCHALK
Commissioner of Patent